United States Patent
Nakajima et al.

(10) Patent No.: US 6,423,815 B1
(45) Date of Patent: Jul. 23, 2002

(54) LAYER INSULATING FILM FOR MULTILAYER INTERCONNECTION, RESIN USED THEREFOR AND PROCESS FOR PRODUCING THE SAME

(75) Inventors: Michio Nakajima, Kawasaki (JP); Maki Tokuhiro, Boston, MA (US); Hidenori Saito, Yokohama; Saiko Yoshihashi, Kanagawa-ken, both of (JP)

(73) Assignee: Sumitomo Bakelite Company, Limited, Tokyo (JP)

( * ) Notice: Subject to any disclaimer, the term of this patent is extended or adjusted under 35 U.S.C. 154(b) by 83 days.

(21) Appl. No.: 09/650,703

(22) Filed: Aug. 29, 2000

(30) Foreign Application Priority Data

Aug. 30, 1999 (JP) .......................... 11-244090

(51) Int. Cl.$^7$ ............................. C08G 63/44
(52) U.S. Cl. .................. 528/288; 528/335; 528/337
(58) Field of Search ................. 528/335, 337, 528/288

(56) References Cited

U.S. PATENT DOCUMENTS 6,103,860 A * 8/2000 Yamashita et al. .......... 528/310

* cited by examiner

*Primary Examiner*—Edward J. Cain
(74) *Attorney, Agent, or Firm*—Smith, Gambrell & Russell, LLP

(57) ABSTRACT

The present invention provides a layer insulating film for multilayer interconnection of semiconductors which is excellent in resistance to heat, resistance to moisture absorption as well as in electric characteristic properties, and a process for producing the film. That is, a layer insulating film for multilayer interconnection of semiconductors which comprises a fluorine-containing polybenzoxazole resin having the structure represented by the formula (6) and obtained by a process which comprises subjecting to heat-dehydrating ring closure a fluorine-containing polyhydroxyamide resin obtained by reacting a dicarboxylic acid diester obtained from one kind of compound selected from the group of compounds represented by the formulas (2) and 2,2'-bis(trifluoromethyl)-4,4'-biphenyldicarboxylic acid, with 2,2-bis(3-amino-4-hydroxyphenyl)hexafluoropropane,

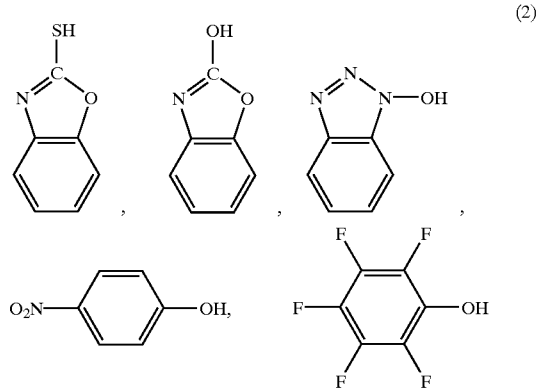

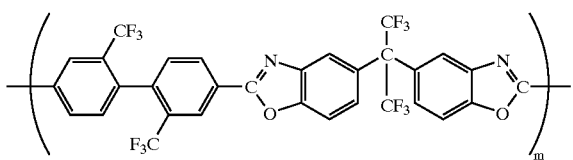

(in the formula (6), m is an integer of 10–500).

11 Claims, No Drawings

LAYER INSULATING FILM FOR MULTILAYER INTERCONNECTION, RESIN USED THEREFOR AND PROCESS FOR PRODUCING THE SAME

BACKGROUND OF THE INVENTION

The present invention relates to a layer insulating film for multilayer interconnection of semiconductors which comprises a fluorine-containing polybenzoxazole resin, and a process for producing the resin used therefor.

Inorganic insulating films using silicon dioxide formed by the chemical vapor deposition method, etc. have been in use as a material for layer insulation. However, though the films have a high heat resistance, they have not sufficiently good performance characteristics to meet the requirements related to semiconductor uses of recent years.

On the other hand, polyimide resins have been extensively studied as an organic insulating film which exhibits an excellent flatness and low dielectric constant, but they have a problem in resistance to moisture absorption and hence cannot be considered to have satisfactory performance characteristics as a material for layer insulating film.

Similar studies have also been made of polybenzoxazole resins. One of the processes for producing polyhydroxyamide resin, the precursor of polybenzoxazole resin, is an acid chloride method which allows a dicarboxylic acid dichloride to react with a bis(aminophenol) compound; but since chloride ions formed in the course of the synthesis get mixed as an impurity, the resulting resin is not so much preferable for use as a semiconductor material. Another method which does not involve the risk of contamination by chloride ions is the DCC method which uses dicyclohexylcarbodiimide (hereinafter abbreviated as DCC) and directly obtains polyhydroxyamide resin from a dicarboxylic acid and a bis(aminophenol) compound. However, when a material of low reactivity as 2,2-bis(3-amino-4-hydroxyphenyl) hexafluoropropane is used in the DCC method, the polyhydroxyamide resin obtained has a low molecular weight, and does not have satisfactory heat resistance, strength, etc.

SUMMARY OF THE INVENTION

The object of the present invention is, overcoming the above-mentioned problems of the prior art, to provide a layer insulating film for multilayer interconnection of semiconductors excellent in resistance to heat, resistance to moisture absorption and additionally excellent in electric characteristics and a process for producing a resin used therefor.

The present inventors have made extensive study to solve the above-mentioned problems of previous layer insulating film material for multilayer interconnection. As a result, the inventors have found a fluorine-containing polybenzoxazole resin excellent in resistance to heat, resistance to moisture absorption and further in electric characteristics having the structure represented by the formula (6) and obtained by a production process which comprises subjecting to heat-dehydrating ring-closure (A) a fluorine-containing polyhydroxyamide resin having the structure represented by the formula (1) and obtained by reacting a dicarboxylic acid diester obtained by purifying a product obtained by the reaction of at least one kind of compound selected from the group of compounds represented by-the formulas (2) with 2,2'bis-(trifluoromethyl-4,4'1-biphenyldicarboxylic acid, with 2,2-bis(3-amino-4-hydroxyphenyl)hexafluoropropane; or (B) a fluorine-containing polyhydroxyamide resin obtained by reacting a product obtained by replacing less than 50% by mole of 2,2'-bis(trifluoromethyl)-4,4'-biphenyldicarboxylic acid diester by a dicarboxylic acid diester obtained by purifying a product obtained by the reaction of a dicarboxylic acid represented by R of the formula (3) with one kind of compound selected from the group of compounds represented by the formulas (2), with a product obtained by replacing less than 50% by mole of 2,2-bis(3-amino-4-hydroxyphenyl)hexafluoropropane by a bisaminophenol represented by R'of the formula (3). The present invention has been accomplished on the basis of the above finding.

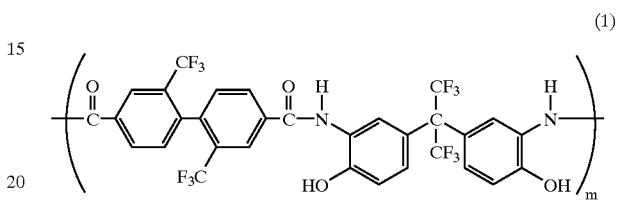

wherein m is an integer of 10–500,

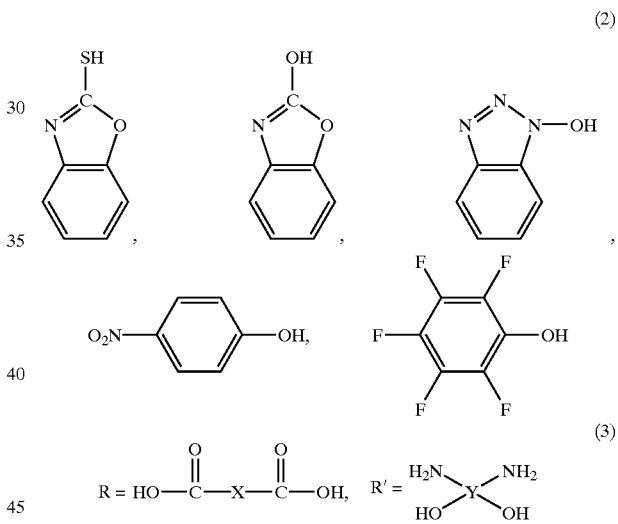

wherein X and Y each independently represent a structure selected from the formulas (4),

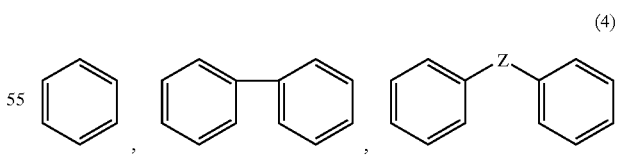

wherein Z represents a structure selected from the formulas (5), provided that the hydrogen atom(s) on the benzene ring in these structures may be substituted with at least one member selected from the group consisting of methyl group, ethyl group, propyl group, isopropyl group, butyl group, isobutyl group, t-butyl group, fluorine atom and trifluoromethyl group.

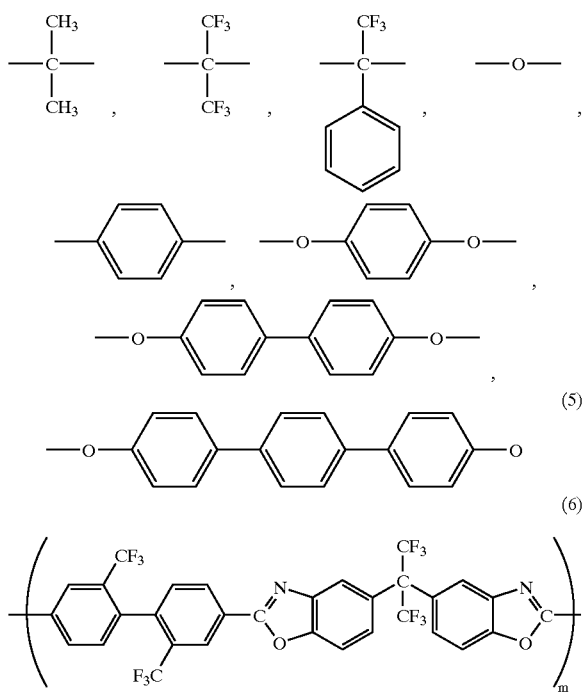

wherein, in the formula (6), m is an integer of 10–500.

DETAILED DESCRIPTION OF THE INVENTION

In the present invention, the fluorine-containing polyhydroxyamide resin having the structure represented by the formula (1) is produced by the reaction of a diamine component and a dicarboxylic acid component, the diamine component used being 2,2-bis(3-amino-4-hydroxyphenyl) hexafluoropropane.

The dicarboxylic acid component used is a dicarboxylic acid diester obtained by the reaction of 2,2'-bis-(trifluoromethyl)-4,4'-biphenyldicarboxylic acid with one kind of compound selected from the group of compounds represented by the above-mentioned formulas (2), e.g., 1-hydroxybenzotriazole, 4-nitro-phenol, 2-mercaptobenzoxazole, and the like. Among the group of compounds represented by the formulas (2), more preferably be used is 1-hydroxybenzotriazole.

As to the diamine component, the intended effect of the present invention can be attained also when a part of 2,2-bis(3-amino-4-hydroxyphenyl)hexafluoropropane is replaced by a bisaminophenol compound represented by R'of the formula (3), provided that the replaced part must be less than 50% in terms of molar ratio of monomer. The bisaminophenol compound represented by R'of the formula (3) may be, for example, 2,4-diaminoresorcinol, 2,2-bis(3-amino-4-hydroxyphenyl)propane, 1,4-bis(3-amino-4-hydroxyphenyl)tetrafluorobenzene, 3,3'-diamino-4,4'-dihydroxybiphenyl, 3,3'-diamino-5,5', 6,6'-tetrafluoro-4,4'-dihydroxybiphenyl, 2,2-bis(3-amino-4-hydroxy-5-trifluoromethylphenly)hexafluoropropane, 2,2-bis(4-amino-3-hydroxy-5-trifluoromethylphenyl)hexafluoropropane, 2,2-bis(3-amino-4-hydroxy-5-pentafluoroethylphenyl) hexafluoropropane, 2-(3-amino-4-hydroxy-5-trifluoromethylphenyl)-2-(3-amino-4-hydroxy-5-pentafluoroethylphenyl)hexafluoropropane, etc., but it is not limited thereto.

As to the dicarboxylic acid component, like in the case of the bisaminophenol compound, the intended effect of the present invention can be attained also when a part of 2,2'-bis(trifluoromethyl)-4,4'-biphenyldicarboxylic acid is replaced by a dicarboxylic acid represented by R of the formula (3), provided that the replaced part must be less than 50% in terms of molar ratio of monomer. The dicarboxylic acid represented by R of the formula (3) may be, for example, 5-fluoroisophthalic acid, 2-fluoroisophthalic acid, 3-fluorophthalic acid, 4-fluorophthalic acid, 2-fluoroterephtalic acid, 2,4,5,6-tetrafluoroisophthalic acid, 3,4,5,6-tetrafluorophthalic acid, 4,4'-hexafluoroisopropylidenediphenyl-1,1'-dicarboxylic acid, perfluorosuberic acid, terephthatic acid, isophthalic acid, 4,4'-oxydiphenyl-1,1'-dicarboxylic acid, etc., but it is not limited thereto.

For the synthesis of the dicarboxylic acid diester in the present invention, 2,2'-bis(trifluoromethyl)-4,4'-biphenyldicarboxylic acid and one kind of compound selected from the group of compounds represented by the above-mentioned formulas (2) are dissolved in an anhydrous organic solvent, such as 1,4-dioxane, ethyl acetate, tetrahydrofuran, dimethylformamide, N-methyl-2-pyrrolidone, etc., preferably a condensing agent such as dicyclohexylcarbodiimide, etc., is added thereto at −10 to 5° C., and thereafter the resulting mixture is allowed to react preferably at 15 to 25° C. for 18–24 hours.

The reaction mixture thus obtained is filtered, the filtrate is concentrated by means of an evaporator, a poor solvent, such as diethyl ether, petroleum ether, hexane, etc., is added to the concentrate, and the product thus precipitated is recovered by filtration. Further, the product is mixed with a solvent, such as 2-propanol, then stirred preferably for 30–60 minutes, the resulting product is collected by filtration and dried in vacuum to obtain a purified dicarboxylic acid diester.

Also when the dicarboxylic acid diester is synthesized from the dicarboxylic acid represented by R of the formula (3), the same procedures of reaction and purification of reaction liquids are followed as in using 2,2'-bis (trifluoromethyl)-4,4'-biphenyldicarboxylic acid mentioned above, whereby a purified dicarboxylic acid diester is obtained. The above-mentioned purification step is important for obtaining polyhydroxyamide resin of a high molecular weight.

In the present invention, the fluorine-containing polyhydroxyamide resin is produced by reacting one or two of the above-mentioned dicarboxylic acid diesters with one or two of the above-mentioned diamine components in an anhydrous organic solvent, such as tetrahydrofuran, N-methyl-2-pyrrolidone, γ-butyrolactone, etc., at preferably 60–90° C. for preferably 3 hours or more, more preferably 24–36 hours. At this time, when a dicarboxylic acid diester obtained by using, in the group of compounds represented by the formulas (2), 4-nitrophenol or pentafluorophenol is employed, it is effective to carry out the reaction in the presence of an acid acceptive agent, such as triethylamine, N,N-dimethylaminobenzene, 4-dimethylaminopyridine, pyridine, etc.

The fluorine-containing polybenzoxazole resin of the present invention is produced by subjecting the fluorine-containing polyhydroxyamide resin obtained by the above-mentioned production process to heat-dehydrating ring closure.

The layer insulating film for multilayer interconnection according to the present invention can be produced by dissolving the fluorine-containing polyhydroxyamide resin obtained by the above-mentioned production process in an organic solvent to prepare a varnish of 5–40 wt % concentration, coating the varnish on a wafer or glass plate by such methods of coating as spin coating using a spinner, spray coating using a spray coater, dipping, printing, roll coating and the like to form a film, then drying the film preferably in an inert gas atmosphere at 300–500° C. to obtain a fluorine-containing polyhydroxyamide resin film, and then subjecting the film to heat-dehydrating ring closure to obtain the intended fluorine-containing polybenzoxazole resin film. When a fluorine-containing polyhydroxyamide resin represented by the formula (1) is used, it is converted to a layer insulating film comprising fluorine-containing polybenzoxazole resin having the structure represented by the formula (6) by being subjected to heat-dehydrating ring closure.

The organic solvent which can be used for preparing the above-mentioned varnish may be commonly known aprotic polar organic solvents. Specific examples thereof include N,N-dimethylformamide, N-methyl-2-pyrrolidone, dimethyl sulfoxide, and γ-butyrolactone. The varnish may contain, according to necessity, various additives, for example, an adhesive agent, such as silane coupling agent, and a leveling agent typically represented by fluorine-containing compounds.

The present invention provides a layer insulating film for multilayer interconnection of semiconductors which comprises the fluorine-containing polybenzoxazole resin obtained by the above-mentioned production process.

The film comprising the fluorine-containing polybenzoxazole resin of a high molecular weight obtained according to the present invention has excellent performance characteristics in respect of heat resistance, mechanical strength and electric characteristics and is a film of great industrial value which can be used as the layer insulating film for multilayer interconnection of semiconductors.

DESCRIPTION OF PREFERRED EMBODIMENTS

The present invention is described in more detail below with reference to Examples, but the invention is in no way limited thereto.

The films prepared in Examples and Comparative Examples were used, to evaluate their characteristic properties, for determining the dielectric constant, heat resistance, coefficient of thermal expansion (CTE), water absorption and adhesion according to the following methods.

1. Dielectric Constant

Determination was made according to JIS K6911 at a frequency of 100 KHz by using HP-4284A. Precision LCR meter mfd. by Hewlett Packard Corp.

2. Heat Resistance

By using TG/DTA 220 mfd. by Seiko Instruments K.K. in an atmosphere of nitrogen gas stream of a flow rate of 200 ml/min and at a temperature increasing rate of 10° C./min, the temperature at which the weight loss on heating reached 1% was determined.

3. Coefficient of Thermal Expansion

The coefficient of thermal expansion was determined in the temperature range of 25–100° C. by using TMA/SS 120C mfd. by Seiko Instruments K.K. at a temperature increasing rate of 5° C./min.

4. Water Absorption

According to JIS K6911, the ratio of weight change after immersion in pure water at 23° C. for 24 hours was calculated.

5. Adhesion

According to JIS K5400 and using the crosscut tape method, the state of adhesion of each test piece was visually observed and evaluated in terms of "the number of peeled squares/the number of entire squares"

EXAMPLE 1

(1) Synthesis of Dicarboxylic Acid Diester

In a mixed solvent of 170 ml of anhydrous tetrahydrofuran (THF) and 5 ml of anhydrous N,N-dimethylformamide (DMF) were dissolved 15.13 g of 2,2'-bis(trifluoromethyl)-4,4'-biphenyldicarboxylic acid and 10.82 g of 1-hydroxybenzotriazole, and the resulting solution was cooled to 0–5° C. While the temperature of the solution was kept at 0–5° C., a dicyclohexylcarbodiimide (DCC) solution (a solution of 16.52 g of DCC in 30 ml of anhydrous THF) was added dropwise thereto, and the resulting mixture was stirred at room temperature for 24 hours. Further, 80 ml of anhydrous N-methyl-2-pyrrolidone (NMP) was added thereto and stirred for 30 minutes. The reaction mixture was filtered, the filtrate was concentrated, and 300 ml of hexane was added thereto. The product thus precipitated was recovered by filtration, then mixed with 300 ml of 2-propanol (IPA) and stirred for 60 minutes. The resulting product was separated by filtration, washed with 100 ml of IPA and 100 ml of hexane, and dried in vacuum at 40° C. to obtain 18.3 g of 2,2'-bis(trifluoromethyl)-4,4'-biphenyldicarboxylic acid diester.

(2) Synthesis of Polyhydroxyamide Resin

In a 300-ml flask were placed 30.0 g of 2,2'-bis(trifluoromethyl)- 4,4'-biphenyldicarboxylic acid diester obtained above, 18.9 g of 2,2-bis(3-amino-4-hydroxyphenyl)hexafluoropropane and 200 g of γ-butyrolactone and stirred in nitrogen atmosphere at room temperature for 30 minutes. Thereafter, the mixture was stirred at-a liquid temperature of 60° C. for 12 hours, 70° C. for 5 hours, 80° C. for 12 hours and 90° C. for 5 hours, and then cooled to room temperature. The reaction mixture was filtered, and the filtrate was added dropwise to a solvent mixture of water/IPA =1500 ml/500 ml to obtain a precipitate of polyhydroxyamide resin. The resin was dried, and then its molecular weight was determined with a GPC mfd. by Toso K.K. to find that the weight average molecular weight was 33,000 (based on polystyrene standard).

(3) Preparation of Polybenzoxazole Resin Film

The polyhydroxyamide resin obtained above was dissolved in NMP so as to give a solution of 20 wt % concentration. The solution was coated on a wafer by using a spinner under conditions of a spinning speed of 500 rpm for 10 seconds and then 3000 rpm for 30 seconds, and then baked by using an oven at 120° C. for 10 minutes, at 150° C. for 1 hour and at 400° C. for 1 hour. As the result of the baking, the resin underwent heat-dehydrating ring closure, and a brown, tough film of fluorine-containing polybenzoxazole resin was obtained. By means of infrared absorption spectrum, a peak originating from the C=N stretching of the oxazole ring at 1628 cm$^{-1}$ was confirmed. The film was used for evaluating dielectric constant and adhesion.

Separately, the above-mentioned solution (varnish) was coated on a glass plate by using a doctor blade with a gap of 300 μm. Then, it was dried in an oven at 70° C. for 1 hour, and the resulting coating film was peeled off to obtain a polyhydroxyamide resin film having a film thickness of 20 μm. The film was fixed with a metal mold, and heated successively at 150° C. for 1 hour and at 400° C. for 1 hour to obtain a polybenzoxazole resin film. The film was used as the test piece for evaluating the heat resistance, coefficient of thermal expansion and water absorption. The results of the evaluation are shown in Table 1.

EXAMPLE 2

(1) Synthesis of Dicarboxylic Acid Diester

The same procedures as in Example 1 were followed as in Example 1 except for using 12.10 g of 2-hydroxybenzothiazole in place of 10.82 g of 1-hydroxybenzothiazole used in the synthesis of the dicarboxylic acid diester of Example 1, to obtain 19.2 g of 2,2'-bis(trifluoromethyl)-4,4'-biphenyldicarboxylic acid diester.

(2) Synthesis of Polyhydroxyamide Resin

In a 200-ml flask were placed 16.1 g of the 2,2'-bis (trifluoromethyl)-4,4'-biphenyldicarboxylic acid diester obtained above, 9.63 g of 2,2-bis(3-amino-4-hydroxyphenyl)hexafluoropropane and 100 g of γ-butyrolactone, and were stirred in nitrogen atmosphere at room temperature for 30 minutes. Then the mixture was stirred at a liquid temperature of 60° C. for 12 hours, 70° C. for 5 hours and 80° C. for 12 hours, and cooled to room temperature. The resulting reaction mixture was filtered, and the filtrate was added dropwise to a solvent mixture of water/IPA =1000 ml/200 ml, to obtain a precipitate of polyhydroxyamide resin. The resin was dried and then its molecular weight was determined with a GPC mfd. by Toso K.K. to find that the weight average molecular weight was 21,000 based on polystyrene standard.

(3) Preparation of Polybenzoxazole Resin Film

The polyhydroxyamide resin obtained above was dissolved in NMP so as to give a solution of 20 wt % concentration. Then, in the same manner as in Example 1 except that the solution obtained above was coated on a wafer by using a spinner under conditions of a spinning speed of 500 rpm for 10 seconds and then 2500 rpm for 30 seconds, a polybenzoxazole resin film was prepared and its characteristic properties were evaluated. The results thus obtained are shown in Table 1.

EXAMPLE 3

(1) Synthesis of Dicarboxylic Acid Diester

The same procedures as in Example 1 were followed except for using 14.72 g of pentafluorophenol in place of 10.82 g of 1-hydroxybenzotiazole used in the synthesis of the dicarboxylic acid diester of Example 1, to obtain 15.7 g of 2,2'-bis(trifluoromethyl)-4,4'-biphenyldicarboxylic acid diester.

(2) Synthesis of Polyhydroxyamide Resin

In a 200-ml flask were placed 13.2 g of the 2,2'-bis (trifluoromethyl)-4,4'-biphenyldicarboxylic acid diester obtained above, 7.16 g of 2,2-bis(3-amino-4-hydroxyphenyl)hexafluoropropane, 4.54 g of 4-dimethylaminopyridine and 100 g of γ-butyrolactone, and were stirred in nitrogen atmosphere at room temperature for 30 minutes. Then the mixture was allowed to react at a liquid temperature of 60° C. for 12 hours, 70° C. for 5 hours, 80° C. for 12 hours and 90° C. for 5 hours, and cooled to room temperature. The reaction mixture was filtered, and the filtrate was added dropwise to a solvent mixture of water/IPA =1500 ml/100 ml, to obtain a precipitate of polyhydroxyamide resin. The resin was dried and its molecular weight was determined with a GPC mfd. by Toso K.K. to find that the weight average molecular weight was 19,000 based on polystyrene standard.

(3) Preparation of Polybenzoxazole Resin film

In the same manner as in Example 1 except that the polyhydroxyamide resin obtained above was dissolved in NMP so as to give a solution of 23 wt % concentration, a polybenzoxazole resin film was prepared and its characteristic properties were evaluated. The results thus obtained are shown in Table 1.

EXAMPLE 4

(1) Synthesis of Dicarboxylic Acid Diester

The same procedures as in Example 1 were followed except for using 11.13 g of 4-nitrophenol in place of 10.82 g of 1-hydroxybenzotriazole used in the synthesis of the dicarboxylic acid diester of Example 1, to obtain 10.2 g of 2,2'-bis(trifluoromethyl)-4,4'-biphenyldicarboxylic acid diester.

(2) Synthesis of Polyhydroxyamide Resin

In a 200-ml flask were placed 9.5 g of the 2,2'-bis (trifluoromethyl)-4,4'-biphenyldicarboxylic acid diester obtained above, 5.9 g of 2,2-bis(3-amino-4-hydroxyphenyl) hexafluoropropane, 3.74 g of 4-dimethylaminopyridine and 100 g of γ-butyrolactone, and were stirred in nitrogen atmosphere at room temperature for 30 minutes. The resulting mixture was then stirred at a liquid temperature of 60° C. for 12 hours, 70° C. for 5 hours, 80° C. for 12 hours and 90° C. for 5 hours, and cooled to room temperature. The resulting reaction mixture was filtered, and then the filtrate was added dropwise to a solvent mixture of water/IPA =1,000 ml/100 ml to obtain a precipitate of polyhydroxyamide resin. The resin was dried and its molecular weight was determined with a GPC mfd. by Toso K.K. to find that the weight average molecular weight was 15,000 based on polystyrene standard.

(3) Preparation of Polybenzoxazole Resin Film

The polyhydroxyamide resin obtained above was dissolved in NMP so as to give a solution of 35 wt % concentration. Then, in the same manner as in Example 1 except that the above solution was coated on a wafer by using a spinner under conditions of a number of revolution of 500 rpm for 10 seconds and 3,500 rpm for 30 seconds, a polybenzoxazole resin film was prepared and its characteristic properties were evaluation. The results thus obtained are shown in Table 1.

EXAMPLE 5

(1) Synthesis of Dicarboxylic Acid Diester

The same procedures as in Example 1 were followed except for using 15.70 g 4,4'-hexafluoroisopropylidenediphenyl-1,1'-dicarboxylic acid in place of 15.13 g of 2,2'-bis(trifluoromethyl)-4,4'-biphenyldicarboxylic acid used in the synthesis of the dicarboxylic acid diester of Example 1, to obtain 17.32 g of 4,4'-hexafluoroisopropylidenediphenyl-1,1'-dicarboxylic acid diester.

(2) Synthesis of Polyhydroxyamide Resin

In a 300-ml flask were placed 12.27 g of the 4,4'-hexafluoroisopropylidenediphenyl-1,1'-dicarboxylic acid diester obtained above, 18.00 g of 2,2'-bis(trifluoromethyl)-4,4'-biphenyldicarboxylic acid diester obtained in the same manner as in the synthesis of the dicarboxylic acid diester of Example 1, 11.34 g of 2,2-bis(3-amino-4-hydroxyphenyl) hexafluoropropane, 4.46 g of 3,3'-diamino-4,4'-dihydroxydiphenyl and 200 g of γ-butyrolactone, and were stirred in nitrogen atmosphere at room temperature for 30 minutes. The mixture was then stirred at a liquid temperature of 75° C. for 10 hours and at a liquid temperature of 85° C.for 15 hours and cooled to room temperature. The resulting reaction mixture was filtered and the filtrate was added dropwise to a solvent mixture of water/IPA =1980 ml/220 ml, to obtain a precipitate of polyhydroxyamide resin. The resin was dried and its molecular weight was determined with a GPC mfd. by Toso K.K. to find that the weight average molecular weight was 35,000 based on polystyrene standard.

(3) Preparation of Polybenzoxazole Resin Film

In the same manner as in Example 1 except that the polyhydroxyamide resin obtained above was dissolved in NMP so as to give a solution of 18 wt % concentration, a polybenzoxazole resin film was prepared and its characteristic properties were evaluated. The results thus obtained are shown in Table 1.

EXAMPLE 6

(1) Synthesis of Dicarboxylic Diester

The same procedures as in Example 1 were followed except for using 15.70 g 4,4'-hexafluoroisopropylidenediphenyl-1,1'-dicarboxylic acid in place of 15.13 g of 2,2'-bis(trifluoromethyl)-4,4'-biphenyldicarboxylic acid used in the synthesis of the dicarboxylic acid diester of Example 1, to obtain 17.32 g of a dicarboxylic acid diester.

(2) Synthesis of Polyhydroxyamide Resin

In a 300-ml flask were placed 12.27 g of 4,4'-hexafluoroisopropylidenediphenyl-1,1'-dicarboxylic acid diester obtained in the same manner as in the synthesis of the dicarboxylic acid diester of Example 5, 18.00 g of 2,2'-bis(trifluoromethyl)-4,4'-biphenyldicarboxylic acid diester obtained in the same manner as in the synthesis of the dicarboxylic acid diester of Example 1, 11.34 g of 2,2-bis(3-amino-4-hydroxyphenyl)hexafluoropropane, 5.33 g of 2,2-bis(3-amino-4-hydroxyphenyl)propane and 200 g of γ-butyrolactone, and were stirred in nitrogen atmosphere at room temperature for 30 minutes. Then the mixture was stirred at a liquid temperature of 75° C. for 10 hours and at a liquid temperature of 85° C. for 10 hours, and cooled to room temperature. The resulting reaction mixture was filtered, and the filtrate was added dropwise to a solvent mixture of water/IPA =1700 ml/300 ml, to obtain a precipitate of polyhydroxyamide resin. The resin was dried and then its molecular weight was determined with a GPC mfd. by Toso K.K. to find that the weight average molecular weight was 31,000 based on polystyrene standard.

(3) Preparation of Polybenzoxazole Resin Film

In the same manner as in Example 1 except that the polyhydroxyamide resin obtained above was dissolved in NMP so as to give a solution of 22 wt % concentration, a polybenzoxazole resin film was prepared and its characteristic properties were evaluated. The results thus obtained are shown in Table 1.

Comparative Example 1

(1) Synthesis of Polyhydroxyamide Resin

In 50 g of NMP were dissolved 3.78 g of 2,2'-bis(trifluoromethyl)-4,4'-biphenyldicarboxylic acid and 2.70 g of 1-hydroxybenzotriazole. To the resulting solution, at 0–5° C., was added dropwise a DCC solution (4.12 g of DCC dissolved in 10 g of NMP), and the mixture was then stirred at room temperature for 24 hours.

To the resulting reaction mixture was added 3.85 g of 2,2-bis(3-amino-4-hydroxyphenyl)hexafluoropropane by using 10 g of NMP, and the resulting mixture was allowed to react in nitrogen atmosphere at 75° C. for 24 hours. The reaction mixture was filtered to remove dicyclohexylurea (hereinafter abbreviated as DCU) formed, and the filtrate was added dropwise into a solvent mixture of water 700 ml/IPA 70 ml, to obtain a precipitate of a polybenzoxazole resin precursor. The precursor was dried and then its molecular weight was determined with a GPC mfd. by Toso K.K. to find that the weight average molecular weight was 7,000 based on polystyrene standard.

(2) Preparation of Polybenzoxazole Resin Film

The polybenzoxazole resin precursor obtained above was dissolved in NMP so as to give a solution of 35 wt % concentration. The resulting solution was coated on a wafer by using a spinners under conditions of a spinning speed of 200 rpm for 10 seconds and 1000 rpm for 10 seconds, and then dried by using an oven at 120° C. for 10 minutes, at 150° C.for 1 hour and at 400° C.for 1 hour. As a result, cracks developed, and coating film could not be obtained.

Comparative Example 2

(1) Synthesis of Polyhydroxyamide Resin

While 2.38 g of 2,4,5,6-tetrafluoroisophthalic acid and 3.02 g of 2-mercaptobenzoxazole were being dissolved in NMP, a DCC solution (4.12 g of DCC dissolved in 4 g of NMP) was added dropwise thereto at 5 0–5° C., and the resulting mixture was stirred at room; temperature for-24hours. To the resulting reaction mixture was added-4.07g of 2,2-bis(3-amino-4-hydroxyphenyl)hexafluoropropane by using 6.95 g of NM-P; and the mixture was allowed to react in nitrogen atmosphere at 75° C.for 24 hours. The reaction mixture was filtered to remove DCU formed, and the filtrate was poured into a solvent mixture of 182 ml of water/45.5 ml of IPA, to obtain a yellow precipitate of polyhydroxyamide resin. The resin was dried and then its molecular weight was determined with a GPC mfd. by Toso K.K., to find that the number average molecular weight was 13,000 based on polystyrene standard.

(2) Preparation and Evaluation of Polybenzoxazole Resin Film

The polybenzoxazole resin precursor obtained above was dissolved in NMP so as to give a solution of 25 wt % concentration. The solution obtained was coated on a wafer by using a spinner under conditions of a spinning speed of 800 rpm for 10 seconds and then 2000 rpm for 10 seconds, and dried by using an oven at 120° C. for 10 minutes, at 150° C. for 1 hour and at 350° C. for 3 hours. As the result of the drying, the coating underwent heat ring-closure to obtain a yellow, transparent, tough film. The resin was analyzed by infrared absorption spectroscopy, and a peak originating from the C=N stretching of the oxazole ring at 1628 cm$^{-1}$ was confirmed.

Separately, the above-mentioned solution (varnish) was coated on a glass plate by using a doctor blade with a gap of 300 μm, then dried in an oven at 70° C. for 1 hour, and the coating film was peeled off to obtain a polyhydroxyamide resin film having a film thickness of 20 μm. The film was fixed with a metal mold, and heated successively at 150° C. for 1 hour and at 400° C.for 1 hour to obtain a polybenzoxazole resin film. The film was used as the test piece to evaluate the heat resistance, coefficient of thermal expansion and water absorption. The results obtained are shown in Table 1.

TABLE 1

| | Dielectric constant | Heat resistance (° C.) | CTE (ppm/° C.) | Water absorption (%) | Adhesion |
|---|---|---|---|---|---|
| Example 1 | 2.6 | 524 | 42 | 0.1 | 0/100 |
| Example 2 | 2.6 | 521 | 43 | 0.1 | 0/100 |
| Example 3 | 2.6 | 513 | 42 | 0.1 | 0/100 |
| Example 4 | 2.6 | 509 | 46 | 0.1 | 0/100 |
| Example 5 | 2.7 | 529 | 41 | 0.1 | 0/100 |
| Example 6 | 2.7 | 492 | 51 | 0.1 | 0/100 |
| Comparative Example 1 | — | — | — | — | — |
| Comparative Example 2 | 2.8 | 391 | 61 | 0.4 | 100/100 |

What is claimed is:

1. A process for producing a fluorine-containing polyhydroxyamide resin having the structure represented by the formula (1) which comprises reacting a dicarboxylic acid diester obtained by purifying a product obtained by the reaction of 2,2'-bis(trifluoromethyl)-4,4'-biphenyldicarboxylic acid with one kind of compound selected from the group of compounds represented by the formulas (2), with 2,2-bis(3-amino-4-hydroxyphenyl)hexafluoropropane (1)

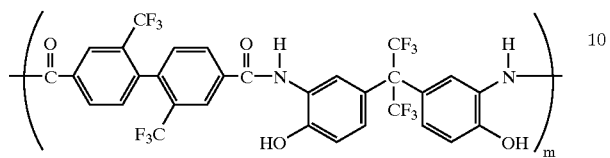

wherein m is an integer of 10–500, (2)

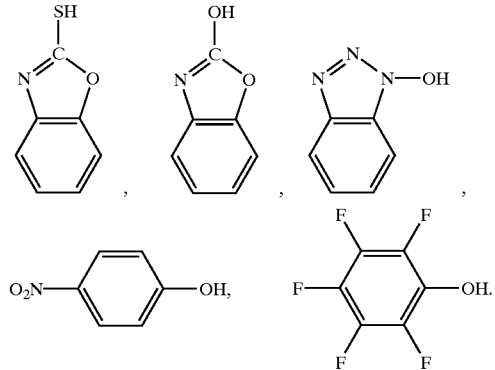

2. The process for producing a fluorine-containing polyhydroxyamide resin according to claim 1 wherein said dicarboxylic acid diester is a product obtained by replacing less than 50% by mole of 2,2'-bis(trifluoromethyl)-4,4'-biphenyldicarboxylic acid diester by a dicarboxylic acid diester obtained by purifying the product obtained by the reaction of a dicarboxylic acid represented by R of the formula (3) with one kind of compound selected from the group of compounds represented by the formulas (2), and wherein less than 50% by mole of said 2,2-bis(3-amino-4-hydroxyphenyl)hexafluoropropane is replaced by a bisaminophenol represented by R' of the formula (3)

(3)

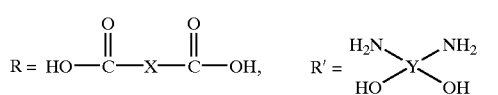

wherein X and Y each independently represent a structure selected from the formulas (4)

(4)

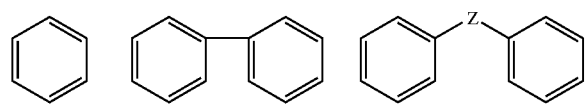

wherein Z represents a structure selected from the formulas (5), provided that the hydrogen atom(s) on the benzene ring in these structures may be substituted with at least one member selected from the group consisting of methyl group, ethyl group, propyl group, isopropyl group, butyl group, isobutyl group, t-butyl group, fluorine atom and trifluoromethyl group,

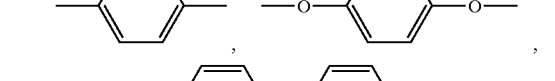
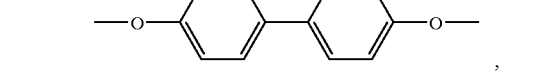
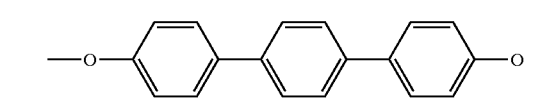

(5)

3. The process for producing a fluorine-containing polyhydroxyamide resin according to claim 1 wherein said one kind of compound selected from the group of compounds represented by the formulas (2) is 1-hydroxybenzotriazole.

4. A fluorine-containing polyhydroxyamide resin having a repeating unit of the formula (1) which is obtained by the process according to claim 1

(1)

wherein m is an integer of 100–500.

5. A fluorine-containing polyhydroxyamide resin obtained by the process according to claim 2.

6. A fluorine-containing polybenzoxazole resin having the structure represented by the formula (6)

(6)

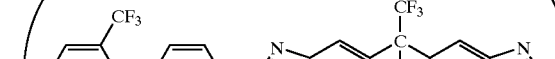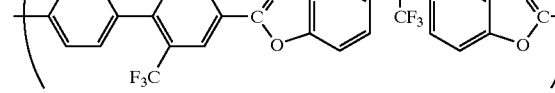

wherein m is an integer of 10–500, which is obtained by subjecting to heat-dehydrating ring closure the fluorine-containing polyhydroxyamide resin obtained by the process according to claim 1.

7. A fluorine-containing polybenzoxazole resin which is obtained by subjecting to heat-dehydrating ring closure the fluorine-containing polyhydroxyamide resin obtained by the process according to claim 2.

8. A fluorine-containing polybenzoxazole resin which is obtained by subjecting to heat-dehydrating ring closure the fluorine-containing polyhydroxyamide resin obtained by the process according to claim 3.

9. A layer insulating film for multilayer interconnection of semiconductors which comprises a polybenzoxazole resin having the structure represented by the formula (6) obtained by subjecting to heat-dehydrating ring closure the fluorine-containing polyhydroxyamide resin obtained by the process according to claim 1.

10. A layer insulating film for multilayer interconnection of semiconductors which comprises a polybenzoxazole resin obtained by subjecting to heat-dehydrating ring closure the fluorine-containing polyhydroxyamide resin obtained by the process according to claim 2.

11. A layer insulating film for multilayer interconnection of semiconductors which comprises a polybenzoxazole resin obtained by subjecting to heat-dehydrating ring closure the fluorine-containing polyhydroxyamide resin obtained by the process according to claim 3.

* * * * *